(12) United States Patent
Cheng et al.

(10) Patent No.: US 9,017,486 B2
(45) Date of Patent: Apr. 28, 2015

(54) DEPOSITION CHAMBER CLEANING METHOD INCLUDING STRESSED CLEANING LAYER

(75) Inventors: Tien-Jen Cheng, Bedford, NY (US); Zhengwen Li, Danbury, CT (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 599 days.

(21) Appl. No.: 12/878,128

(22) Filed: Sep. 9, 2010

(65) Prior Publication Data

US 2012/0061234 A1    Mar. 15, 2012

(51) Int. Cl.
*B08B 7/00* (2006.01)
*B08B 7/04* (2006.01)
*C23C 16/44* (2006.01)
*C23C 14/34* (2006.01)

(52) U.S. Cl.
CPC .............. *B08B 7/04* (2013.01); *B08B 7/0014* (2013.01); *C23C 16/4404* (2013.01); *C23C 14/34* (2013.01)

(58) Field of Classification Search
CPC .... B08B 7/0014; B08B 7/04; C23C 16/4404; C23C 14/34
USPC ............ 134/1, 1.1, 22.1, 4, 26; 438/905
See application file for complete search history.

(56) References Cited

U.S. PATENT DOCUMENTS

| | | | |
|---|---|---|---|
| 4,558,660 A * | 12/1985 | Nishizawa et al. | 118/725 |
| 4,839,145 A * | 6/1989 | Gale et al. | 118/725 |
| 5,356,478 A | 10/1994 | Chen et al. | |
| 6,109,206 A | 8/2000 | Maydan et al. | |
| 6,837,250 B2 | 1/2005 | Langan et al. | |
| 6,855,209 B2 | 2/2005 | Scanlan et al. | |
| 7,028,696 B2 | 4/2006 | Richardson et al. | |
| 7,479,191 B1 | 1/2009 | Entley et al. | |
| 7,622,369 B1 * | 11/2009 | Lee et al. | 438/485 |
| 8,778,464 B2 * | 7/2014 | Losio et al. | 427/569 |
| 2005/0064684 A1 * | 3/2005 | Todd et al. | 438/478 |
| 2005/0089699 A1 | 4/2005 | Lin et al. | |
| 2005/0092357 A1 * | 5/2005 | Deng | 136/252 |
| 2006/0093756 A1 * | 5/2006 | Rajagopalan et al. | 427/569 |
| 2006/0151002 A1 | 7/2006 | Kumar | |
| 2006/0201533 A1 | 9/2006 | Wani et al. | |
| 2009/0008239 A1 | 1/2009 | Sorensen et al. | |
| 2009/0093080 A1 * | 4/2009 | Choi et al. | 438/73 |
| 2009/0208668 A1 * | 8/2009 | Choi et al. | 427/569 |
| 2010/0024840 A1 | 2/2010 | Hsieh et al. | |

FOREIGN PATENT DOCUMENTS

WO    WO2007093921 A2    8/2007

* cited by examiner

*Primary Examiner* — Alexander Markoff

(74) *Attorney, Agent, or Firm* — Cantor Colburn LLP; William Steinberg

(57) ABSTRACT

A method for cleaning a deposition chamber includes forming a deposited layer over an interior surface of the deposition chamber, wherein the deposited layer has a deposited layer stress and a deposited layer modulus; forming a cleaning layer over the deposited layer, wherein a material comprising the cleaning layer is selected such that the cleaning layer adheres to the deposited layer, and has a cleaning layer stress and a cleaning layer modulus, wherein the cleaning layer stress is higher than the deposited layer stress, and wherein the cleaning layer modulus is higher than the deposited layer modulus; and removing the deposited layer and the cleaning layer from the interior of the deposition chamber.

15 Claims, 4 Drawing Sheets

100

```
FORM DEPOSITED LAYER ON SUBSTRATE IN CHAMBER
(DEPOSITED LAYER ALSO FORMS ON INTERIOR SURFACES OF CHAMBER);
REMOVE SUBSTRATE FROM CHAMBER
101
         ↓
FORM CLEANING LAYER HAVING HIGHER STRESS AND MODULUS
THAN DEPOSITED LAYER OVER DEPOSITED LAYER
102
         ↓
PERFORM RF AND RPS CLEANING TO REMOVE
CLEANING LAYER AND DEPOSITED LAYER FROM INTERIOR OF CHAMBER
103
```

100

```
┌─────────────────────────────────────────────────────────────────┐
│ FORM DEPOSITED LAYER ON SUBSTRATE IN CHAMBER                    │
│ (DEPOSITED LAYER ALSO FORMS ON INTERIOR SURFACES OF CHAMBER);   │
│ REMOVE SUBSTRATE FROM CHAMBER                                   │
│ 101                                                             │
└─────────────────────────────────────────────────────────────────┘
                                 ⬇
┌─────────────────────────────────────────────────────────────────┐
│ FORM CLEANING LAYER HAVING HIGHER STRESS AND MODULUS            │
│ THAN DEPOSITED LAYER OVER DEPOSITED LAYER                       │
│ 102                                                             │
└─────────────────────────────────────────────────────────────────┘
                                 ⬇
┌─────────────────────────────────────────────────────────────────┐
│ PERFORM RF AND RPS CLEANING TO REMOVE                           │
│ CLEANING LAYER AND DEPOSITED LAYER FROM INTERIOR OF CHAMBER     │
│ 103                                                             │
└─────────────────────────────────────────────────────────────────┘
```

FIG. 1

DEPOSITION CHAMBER CLEANING METHOD INCLUDING STRESSED CLEANING LAYER

BACKGROUND

This disclosure relates generally to the field of semiconductor manufacturing processes, and more specifically to cleaning of a deposition chamber used in a semiconductor manufacturing process.

Deposition processes may be used in semiconductor manufacturing to form a uniform layer of a material, such as a metal, a dielectric material, or a semiconducting material, on a substrate. The material may be deposited on the substrate using a plasma in a deposition chamber, which may be a vacuum chamber. Plasma tools used for deposition processes, such as chemical vapor deposition (CVD), sputtering, and so forth, may employ inductive coupling or capacitive coupling to strike and maintain the plasma in the deposition chamber. One advantage of inductively coupled plasmas is that they are generated with much smaller bias voltage on the substrate, reducing the likelihood of damage thereto. In addition, inductively coupled plasmas have a higher ion density, thereby providing higher deposition rates and mean free paths, while operating at a much lower pressure than capacitively coupled plasmas. These advantages allow in situ sputtering and/or ion directionality during processing.

High density plasma (HDP) CVD processes may be used to provide a combination of chemical reactions and physical sputtering. HDP-CVD processes promote the disassociation of the reactant gases by the application of radio frequency (RF) energy to the reaction zone proximate to the substrate surface, thereby creating a plasma of highly reactive ionic species. The relatively non-reactive ionic constituents, i.e., argon (Ar), are given high momentum (efield) to dislodge deposited film material selectively from specific areas along the profile of the film based on a sputter yield curve. The high reactivity of the released ionic species reduces the energy required for a chemical reaction to take place, thus lowering the required temperature for these processes.

The goal in most HDP-CVD processes is to deposit a film of uniform thickness across the surface of a substrate, while also providing good gap fill between lines and other features formed on the substrate. Deposition uniformity and gap via fill are very sensitive to source configuration, gas flow changes, source RF generator power, bias RF generator power, gas nozzle design, including symmetry in distribution of nozzles, the number of nozzles, the height of the nozzles above the substrate support, and the lateral position of the nozzles relative to the substrate support. These variables change and processes are performed within the tool change and as process gases change.

One problem encountered in semiconductor manufacturing is deposition of material on the deposition chamber itself during deposition on the substrate. During deposition, the material deposits not only on the substrate, but throughout the chamber interior, on the substrate support member (pedestal), and on the gas distribution components (shower head). Over time, built up material on the chamber interior may flake off into the chamber during subsequent processing of a substrate, resulting in particle contamination of the substrate, which can compromise the integrity of the device being fabricated. Thus, the chamber must be periodically cleaned to prevent particles issues by removing any films deposited on the pedestal, shower head, and chamber wall.

A CVD process may include a chamber clean after every deposition, while a metal sputtering chamber may be cleaned only after certain cycles. Standard deposition chamber cleaning processes may require multiple iterations of radiofrequency (RF) and remote plasma source (RPS) cleaning steps to thoroughly remove deposited material from the chamber interior. RF cleaning energizes gas plasma including ions, electrons, radicals, and metastables to remove the carbon or hydrocarbons in the film located on the chamber interior through a chemical reaction with an active gas, such as oxygen. RPS cleaning provides a gentler cleaning step to further clean around chamber areas including the showerhead. Many iterations of RF and RPS cleaning steps may be necessary in order to sufficiently clean the chamber, which may require a relatively long period of time for the cleaning process. During the cleaning process, the deposition chamber may not be used for device fabrication, which decreases throughput for the fabrication process.

After cleaning, the shower head and chamber wall may be coated with another film prior to subsequent deposition. This additional coating step, known as seasoning, is needed to prevent plasma damage to the chamber wall during subsequent deposition processes. The chamber clean process needs to effectively remove all residual films from the chamber before seasoning. In order to sufficiently clean all exposed chamber surfaces, the length of time allotted for the cleaning process may be increased, which increases idle time for the chamber and decreases throughput for the manufacturing process. The cleaning process may also be performed using higher temperatures, which may effectively overclean the chamber surfaces, and increase the cost of consumables and/or maintenance intervals for the tool. Switching chamber temperature for cleaning is usually not preferred by manufacturing since it requires additional time for chambers to stabilize after cleaning Also, excessive cleaning time and temperatures may be damaging to the deposition chamber.

SUMMARY

An exemplary embodiment of a method for cleaning a deposition chamber includes forming a deposited layer over an interior surface of the deposition chamber, wherein the deposited layer has a deposited layer stress and a deposited layer modulus; forming a cleaning layer over the deposited layer, wherein a material comprising the cleaning layer is selected such that the cleaning layer adheres to the deposited layer, and has a cleaning layer stress and a cleaning layer modulus, wherein the cleaning layer stress is higher than the deposited layer stress, and wherein the cleaning layer modulus is higher than the deposited layer modulus; and removing the deposited layer and the cleaning layer from the interior of the deposition chamber.

An exemplary embodiment of a deposition chamber includes a deposited layer formed over an interior surface of the deposition chamber, wherein the deposited layer has a deposited layer stress and a deposited layer modulus; and a cleaning layer formed over the deposited layer, wherein a material comprising the cleaning layer is selected such that the cleaning layer adheres to the deposited layer, and has a cleaning layer stress and a cleaning layer modulus, wherein the cleaning layer stress is higher than the deposited layer stress, and wherein the cleaning layer modulus is higher than the deposited layer modulus.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES:

FIG. 1 illustrates an embodiment of a method for deposition chamber cleaning including a stressed cleaning layer.

DETAILED DESCRIPTION

Embodiments of a method for deposition chamber cleaning including stressed cleaning layer are provided, with exemplary embodiments being discussed below in detail. The deposition chamber may be a chamber that is used for any semiconductor deposition process, including but not limited to chemical vapor deposition (CVD) or sputtering. After formation of a deposited layer on a substrate in the chamber, RF and RPS cleaning steps are performed in the deposition chamber before use the chamber to form a deposited layer on another substrate. However, successive iterations of RF and RPS cleaning steps may be eliminated by deposition of a stressed cleaning layer over the deposited layer inside the deposition chamber before performing RF and RPS cleaning. The cleaning layer may include a material having a good adhesion to the deposited layer and a higher stress and modulus as compared to the deposited layer. The difference in stress between the deposited layer and cleaning layer may cause both the cleaning layer and deposited layer to break off the inside surfaces of the deposition chamber (such as the chamber wall, shower head, or pedestal) with relatively few iterations of RF and RPS cleaning. Only one iteration of RF and RPS may be required to clean the deposition chamber in some embodiments. Reduction of the number of RF and RPS cleaning steps allows for increased throughput for the semiconductor manufacturing process using the deposition chamber, while reducing or eliminating particle issues that may compromise the properties of a deposited layer formed on a substrate by the deposition chamber.

Figure 2:
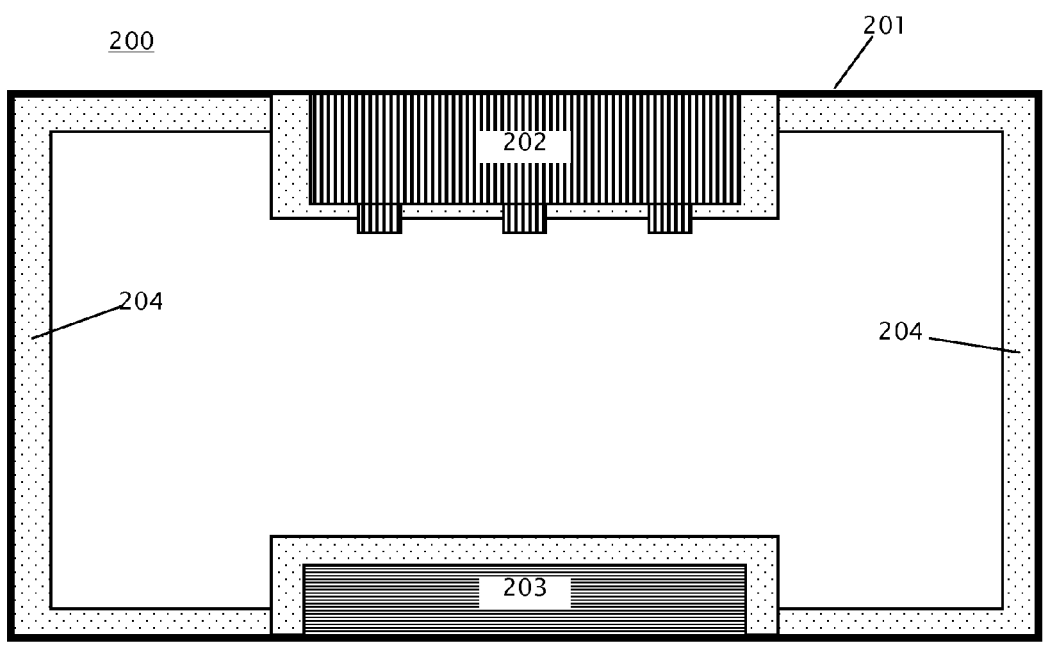
FIG. 2 illustrates an embodiment of a deposition chamber after formation of a deposited layer on an interior of the deposition chamber.

FIG. 1 illustrates an embodiment of a method 100 for cleaning for a deposition chamber including a stressed cleaning layer. FIG. 1 is discussed with respect to FIGS. 2-4. In block 101, a deposited layer is formed on a substrate located on a pedestal located at the bottom of the deposition chamber. The deposited layer may be formed by CVD or sputtering in some embodiments. The material comprising the deposited layer may be introduced into the deposition chamber via a shower head located at the top of the deposition chamber. The substrate is then removed from the deposition chamber. The deposited layer may include any material that may be deposited on a substrate in a semiconductor manufacturing process, including but not limited to a metal, a dielectric material, or a semiconductor material. The deposited layer may also form on the interior of the deposition chamber, including the chamber walls, pedestal, and shower head, during formation of the deposited layer on the substrate, as shown in FIG. 2. FIG. 2 illustrates an embodiment 200 of a deposition chamber 201 after formation of the deposited layer 204 on a substrate (not shown) and on the interior of the deposition chamber 201, and after removal of the substrate from the pedestal 203. Deposited layer 204 forms on the interior walls of deposition chamber 201, and also on shower head 202 and pedestal 203. Deposited layer 204 is shown for illustrative purposes only; a deposited layer may form on any portion of the interior of a deposition chamber with varied thickness, uniformity, and distribution in various process embodiments. Deposition chamber 201, with shower head 202 and pedestal 203, is also shown for illustrative purposes only; method 100 may be implemented using any appropriate configuration of deposition chamber. In some embodiments, deposited layer 204 may include both a seasoning layer, which is deposited over the interior of chamber 201 before introduction of the substrate into the chamber and acts to protect the interior of chamber 201 during deposition on the substrate, and a layer of the material that is subsequently deposited on the substrate. The seasoning layer may include silicon nitride (SiN) in some embodiments. Deposited layer 204 has a stress and modulus that is determined by the material comprising deposited layer 204.

Figure 3:
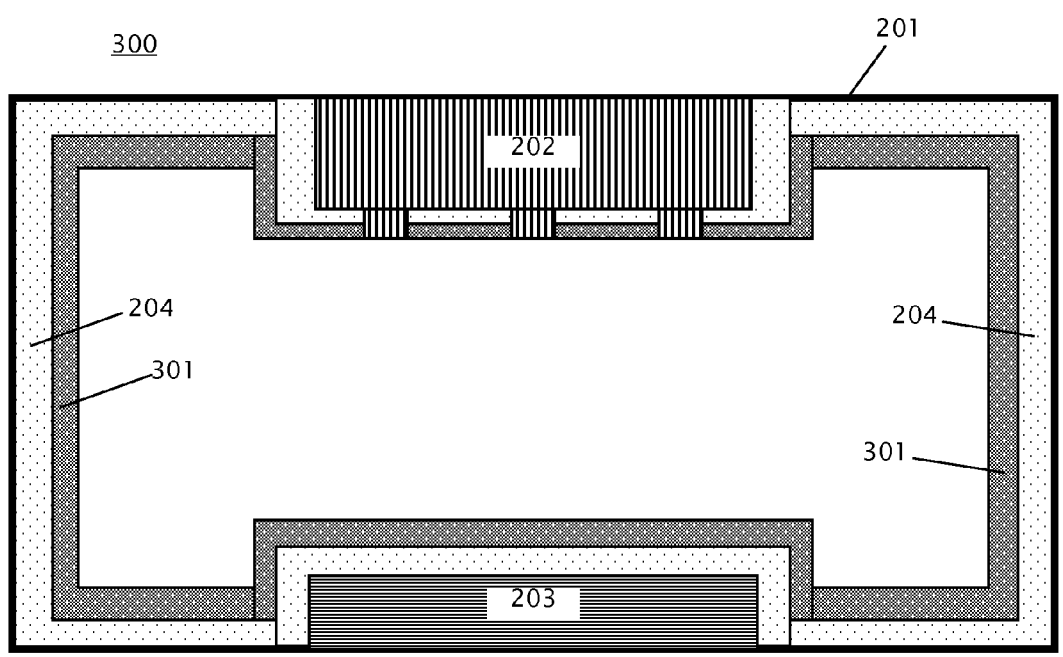
FIG. 3 illustrates an embodiment of a deposition chamber of FIG. 2 after formation of a stressed cleaning layer over the deposited layer.

In block 102, a stressed cleaning layer 301 is deposited over deposited layer 204 in the interior of deposition chamber 201, as shown embodiment 300 of FIG. 3. The material comprising cleaning layer 301 may be introduced into the deposition chamber 201 via shower head 202. The cleaning layer 301 may be formed by CVD or sputtering in some embodiments. The material comprising cleaning layer 301 is selected such that cleaning layer 301 has a good adhesion to the deposited layer, and a stress and modulus that is higher than the stress and modulus of deposited layer 204. The cleaning layer can be readily deposited but with different process parameter settings, such as flowrate, additional gas/chemicals, or radio frequency power. The difference in stress and modulus between cleaning layer 301 and deposited layer 204 induces stress in deposited layer 204. In an embodiment in which deposited layer 204 includes an low k dielectric, such as amorphous silicon nitride carbon hydrogen material ($SiN_xC_yH$), having a stress from about −140 to about −180 megapascals (mPa), the cleaning layer 301 may include a dielectric material such as silicon nitride carbide (SiNC) having a stress from about −400 to about −490 mPa. The adhesion between the SiNC cleaning layer and the $SiN_xC_yH$ deposited layer is greater than 5 J/m$^2$. The modulus in the cleaning layer 301 is about 70 gigapascals (GPa) higher than that in the deposited layer 204. The cleaning layer with the higher modulus represents a stronger material than the deposited layer 204, so the cleaning layer 301 provides sufficient mechanical strength. Cleaning layer 301 is shown for illustrative purposes only; the cleaning layer may form on any portion of the surface of deposited layer 204 with varied thickness, uniformity, and distribution in various embodiments.

Figure 4:
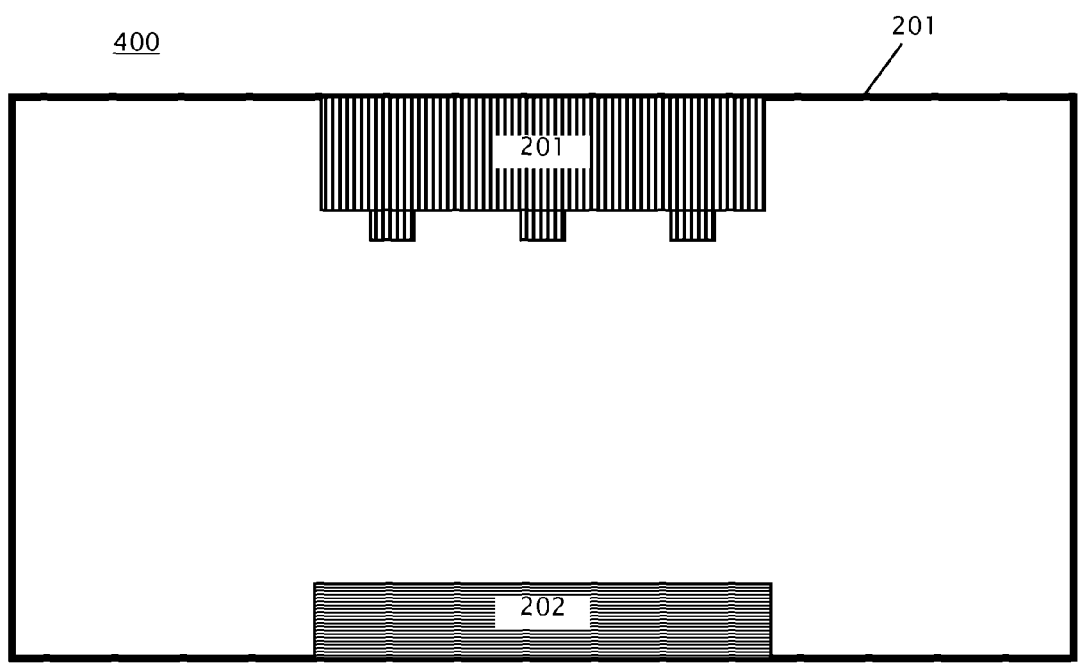
FIG. 4 illustrates an embodiment of a deposition chamber of FIG. 3 after RF and RPS cleaning.

In block 103, RF and RPS cleaning are performed in the deposition chamber 201. The stress induced in the deposited layer 204 by cleaning layer 301 may cause the deposited layer 204 and cleaning layer 301 to break off from the surfaces including the interior walls of deposition chamber 201, the shower head 202, and pedestal 203, requiring relatively few iterations of RF and RPS cleaning In some embodiments, only a single iteration of RF and RPS cleaning may be necessary to remove deposited layer 204 and cleaning layer 301 from the interior of deposition chamber 201. FIG. 4 illustrates an embodiment 400 of a deposition chamber 201 after RF and RPS cleaning, and removal of deposited layer 204 and cleaning layer 301. After RF and PRS cleaning are completed, the deposition chamber 201 shown in FIG. 4 may have a seasoning layer (not shown) formed on the interior of the deposition chamber 201 before introduction of a substrate into the chamber 201 for processing. The seasoning layer may include SiN in some embodiments, and may act to protect the interior of deposition chamber 201 from plasma damage during subsequent deposition of material on a substrate.

Reduction in the number of RF and RPS cleaning steps may significantly increase throughput for the deposition chamber. In one embodiment of a CVD manufacturing tool, throughput may increase by about 25% due to the reduction in cleaning time.

The technical effects and benefits of exemplary embodiments include shorter cleaning time and higher throughput for a deposition chamber used for deposition in a semiconductor manufacturing process.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for cleaning a deposition chamber, the method comprising:
 forming a deposited layer consisting of a deposited layer material on a substrate of a semiconductor manufacturing process and over an interior surface of the deposition chamber, wherein the deposited layer is formed by chemical vapor deposition;
 removing the substrate of the semiconductor manufacturing process from the interior of the deposition chamber after formation of the deposited layer;
 after removing the substrate from the deposition chamber, forming a cleaning layer over the deposited layer, wherein no substrate of any semiconductor manufacturing process is present in the deposition chamber during formation of the cleaning layer, wherein the cleaning layer consists of a cleaning layer material comprising silicon nitride carbide that adheres to the deposited layer, and wherein the cleaning layer material is a different material from the deposited layer material; and
 removing the deposited layer and the cleaning layer from the interior of the deposition chamber.

2. The method of claim 1, wherein the cleaning layer is formed by chemical vapor deposition.

3. The method of claim 1, further comprising:
 forming a first seasoning layer on the interior of the deposition chamber before forming the deposited layer, wherein the substrate is not located in the deposition chamber during formation of the first seasoning layer;
 placing the substrate in the deposition chamber after forming the first seasoning layer and before forming the deposited layer; and
 removing the first seasoning layer from the interior of the deposition chamber with the deposited layer and the cleaning layer.

4. The method of claim 3, wherein the first seasoning layer comprises silicon nitride.

5. The method of claim 1, further comprising forming a second seasoning layer on the interior of the deposition chamber after removing the deposited layer and the cleaning layer from the interior of the deposition chamber.

6. The method of claim 5, wherein the second seasoning layer comprises silicon nitride.

7. The method of claim 1, wherein the deposited layer material comprises a metal.

8. The method of claim 1, wherein the deposited layer material comprises a semiconductor material.

9. The method of claim 1, wherein the deposited layer material comprises a dielectric material.

10. The method of claim 1, wherein removing the deposited layer and the cleaning layer from the interior of the deposition chamber comprises a radiofrequency cleaning step and remote plasma source cleaning step.

11. The method of claim 1, wherein the deposited layer material comprises a low k dielectric material.

12. The method of claim 11, wherein the low k dielectric material that comprises the deposited layer material comprises an amorphous silicon nitride carbon hydrogen ($SiN_xC_yH$) material.

13. The method of claim 1, wherein the adhesion between the deposited layer and the cleaning layer is greater than 5 joules/meter$^2$.

14. The method of claim 1, wherein the cleaning layer induces a stress in the deposited layer.

15. A method for cleaning a deposition chamber, the method comprising:
 forming a deposited layer consisting of a deposited layer material on a substrate of a semiconductor manufacturing process and over an interior surface of the deposition chamber;
 removing the substrate of the semiconductor manufacturing process from the interior of the deposition chamber after formation of the deposited layer;
 after removing the substrate from the deposition chamber, forming a cleaning layer over the deposited layer, wherein no substrate of any semiconductor manufacturing process is present in the deposition chamber during formation of the cleaning layer, wherein the cleaning layer consists of a cleaning layer material comprising silicon nitride carbide that adheres to the deposited layer, wherein the cleaning layer is formed by chemical vapor deposition, and wherein the cleaning layer material is a different material from the deposited layer material; and
 removing the deposited layer and the cleaning layer from the interior of the deposition chamber.

* * * * *